United States Patent [19]
Abatzoglou et al.

[11] Patent Number: 5,748,507
[45] Date of Patent: May 5, 1998

[54] REAL-TIME SUPERRESOLUTION SIGNAL PROCESSING

[75] Inventors: Theagenis J. Abatzoglou, Cupertino; Lawrence K. Lam, San Jose; Homayoun Malek, Los Gatos; John T. Reagan, Mountain View, all of Calif.

[73] Assignee: Lockheed Martin Corporation, Sunnyvale, Calif.

[21] Appl. No.: 689,509

[22] Filed: Aug. 6, 1996

[51] Int. Cl.⁶ .................................................. H03M 1/06
[52] U.S. Cl. .................. 364/572; 364/574; 364/221.4; 360/39; 369/32; 341/131
[58] Field of Search ............................ 364/572, 221.4; 73/1.34, 1.59, 602; 861/861.356; 324/605; 360/39; 369/32; 341/131

[56] References Cited

U.S. PATENT DOCUMENTS

| | | | |
|---|---|---|---|
| 4,750,147 | 6/1988 | Roy, III et al. | 364/807 |
| 5,122,732 | 6/1992 | Engeler et al. | 324/77 E |
| 5,168,214 | 12/1992 | Engeler et al. | 324/77 G |

OTHER PUBLICATIONS

Abatzoglou et al., "Efficient Estimation of 2–Dimensional Frequencies of Sinusoids by the Annihilator Method and Constrained Total Least Squares", 1992.

Abatzoglou, "Frequency Superresolution Performance of the Constrained Total Least Squares Method", 1990.

Elchhorn et al., "Constrianed Frequency Doamin Algorithms for Determination of Parameters of Fundamental Sinewave Signals", 1993.

Abatzoglou, Theagenis J., et al., "The Constrianed Total Least Sqaures Tecnique and its Application to Harmonic Superresolution", *IEEE Transactions on Signal Processing*, May 1991, vol. 39, No. 5, pp. 1070–1087, U.S.A.

Silverstein, Seth D., et al., "Parallel Architectures for Multirate Superresolution Spectrum Analyzers", *IEEE Transactions on Circuits and Systems*, Apr. 1991, vol. 38, No. 4, pp. 449–453, U.S.A.

Steedly, William M., et al, "A Modified TLS–Prony Method Using Data Decimation" *IEEE Transactions on Signal Processing*, Sep. 1994, vol. 42, No. 9, pp. 2292–2303, U.S.A.

*Primary Examiner*—Emanuel T. Voeltz
*Assistant Examiner*—Patrick J. Assouad
*Attorney, Agent, or Firm*—Fenwick & West LLP

[57] ABSTRACT

A signal processing system and method capable of real-time implementation for extracting signal parameter information with high accuracy and resolution. Signals (101) are passed through a filter bank (102), downconverted and decimated. The superresolution technique of constrained total least squares (CTLS) is used to process the resulting samples to obtain frequency components and their amplitudes (106). CTLS may also be used to obtain decaying coefficients associated with each frequency components. If desired, the results of CTLS may be used to extend original data for higher resolution spectral analysis and output (109).

10 Claims, 10 Drawing Sheets

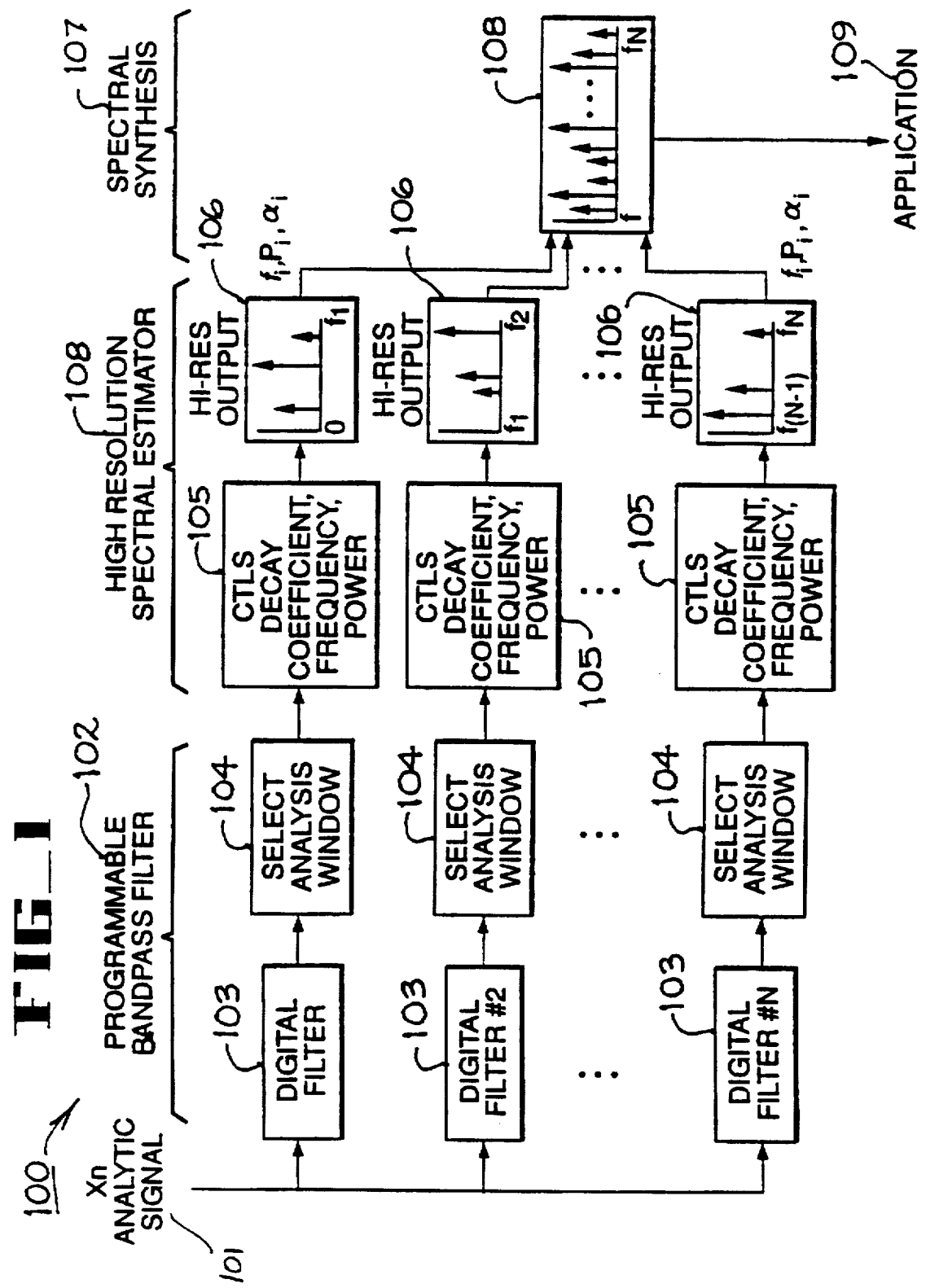

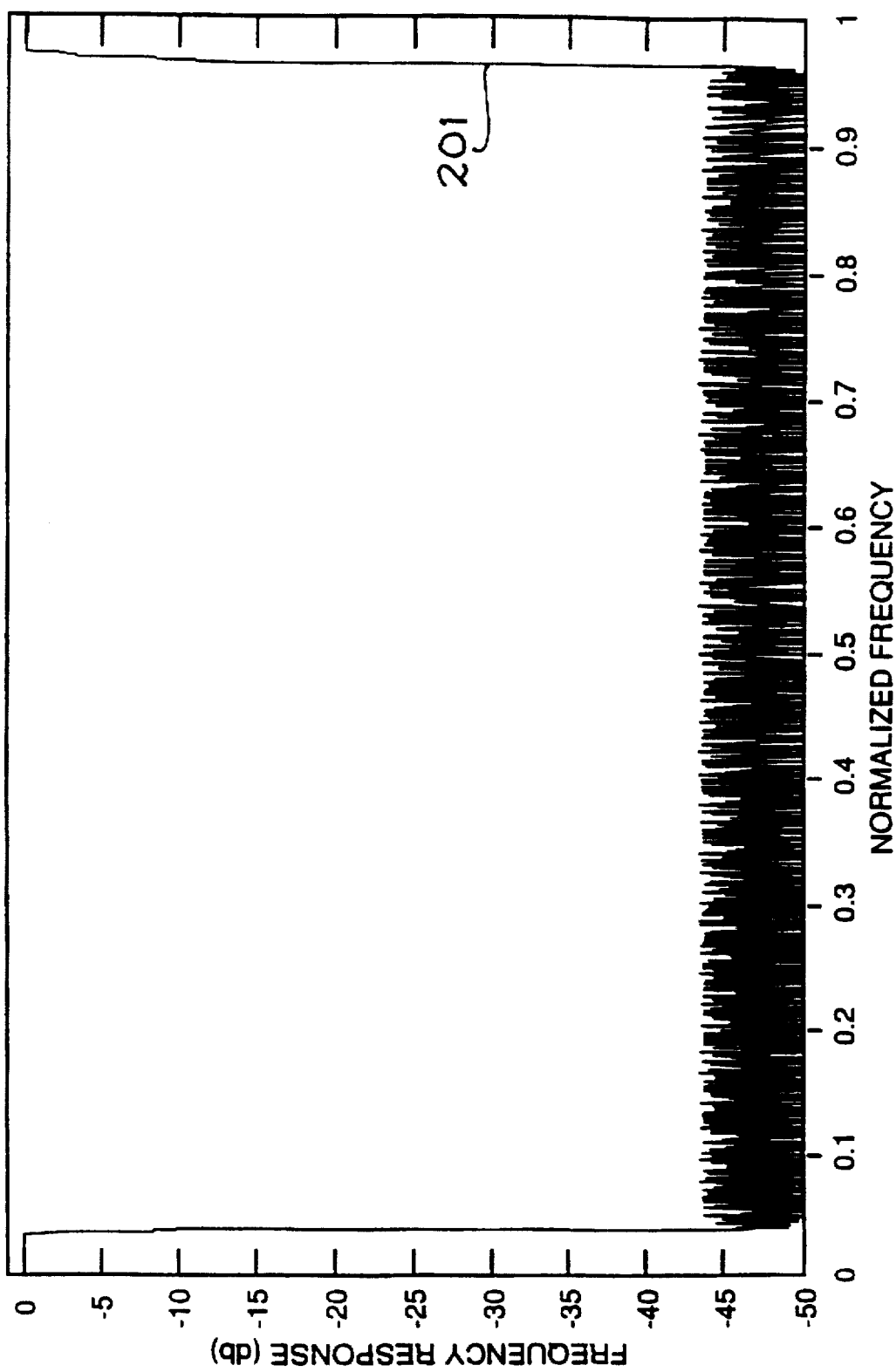
FIG_2

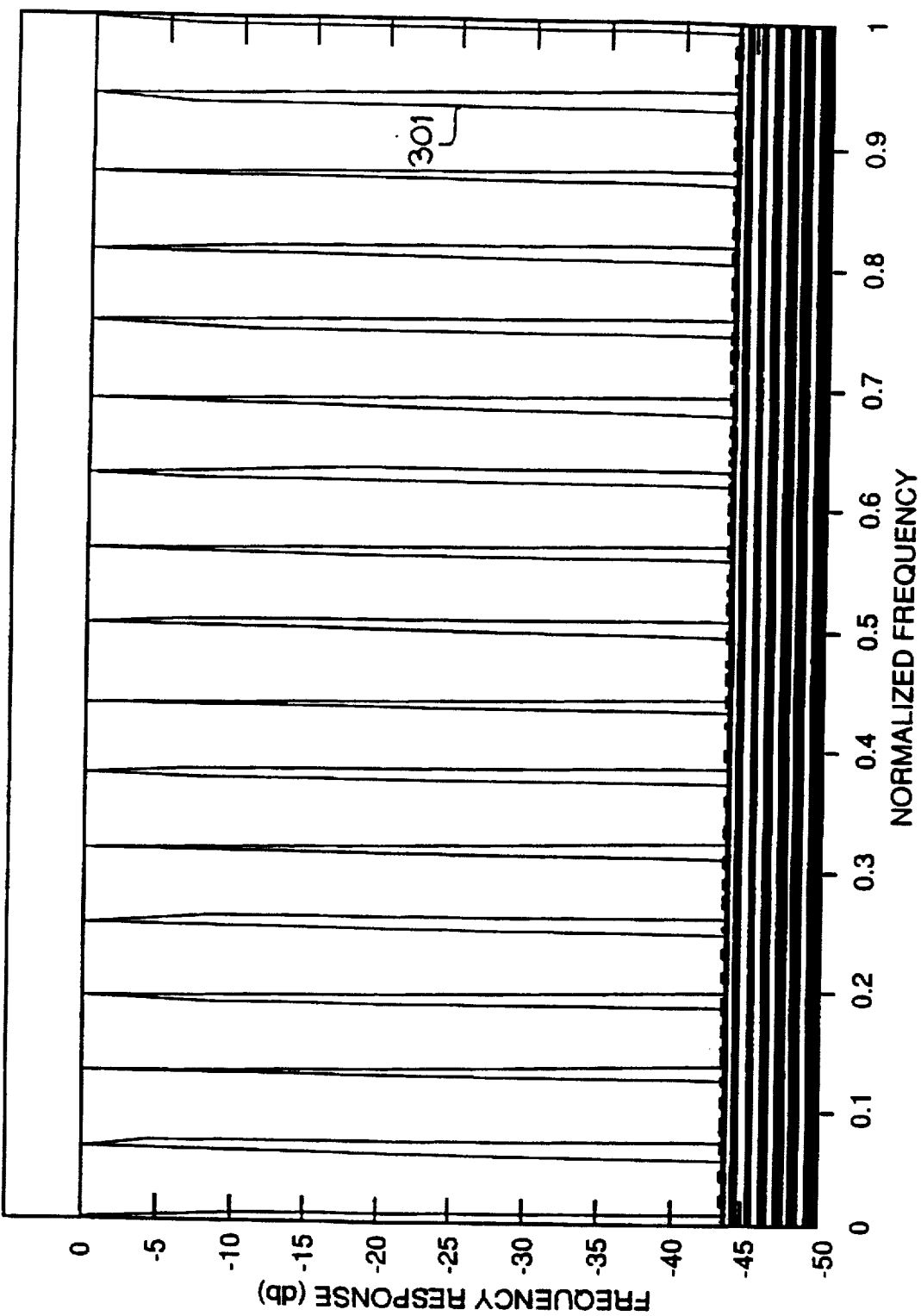

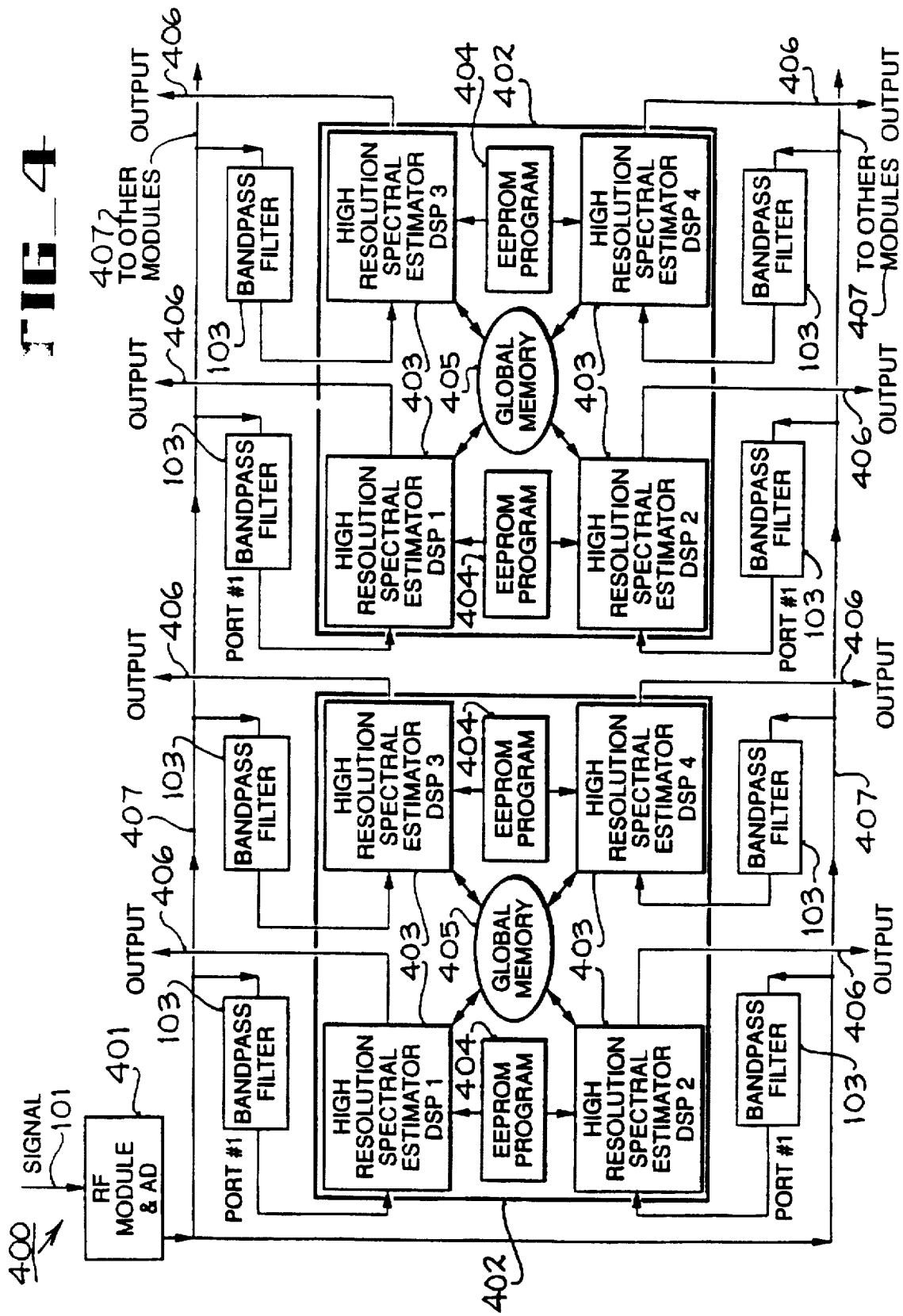
FIG_4

Real part of time-series from the superposition of 2 sinusoids

FFT Spectrum of 20 dB sinusoids at frequencies 0.1 and 0.2

Superresolution CTLS Spectrum of 20 dB sinusoids at frequencies 0.1 and 0.2

REAL-TIME SUPERRESOLUTION SIGNAL PROCESSING

BACKGROUND OF THE INVENTION

1. Field of the Invention

This invention relates to superresolution signal processing and spectral analysis and, more particularly, to a system and method of combining a subband filter approach with the constrained total least squares (CTLS) parameter estimation technique to produce improved estimation of frequency line components in real time.

2. Description of Background Art

There exist several known techniques for determining the frequency components of a time series from its time samples. One commonly used technique is the Fast Fourier Transform (FFT), a well-known algorithm for deriving the signal spectrum showing amplitude of various frequency components.

FFT and other known techniques of signal processing and spectral analysis suffer from problems of insufficient frequency resolution which limit their applicability in real-time environments. In particular, such real-time environments may impose limits on the number of time-series samples that can be obtained, which in turn limits the frequency resolution of the derived spectrum. Resolution is proportional to the observation time of the signal. For example, as is further described below, a Fast Fourier Transform applied to a time series containing a 100 Hz sinusoidal component and a 105 Hz sinusoidal component, when 100 samples are available, fails to resolve the two components.

Therefore, in situations where spectral analysis is required for a signal that is observable for only a limited period of time, currently known techniques may provide insufficient resolution. Such limitations on observation time of the signal may be present due to, for example, short duration of the signal, time variation in signal characteristics, or a need for quick response to the signal.

Some past attempts at superresolution signal processing have provided somewhat improved resolution, but are too computationally intensive for real-time applications, and often provide sub-optimal results. See, for example, Burg. J. P., "Maximum Entropy Spectral Analysis," Ph.D. dissertation, Department of Geophysics, Stanford University, Stanford, Calif.; D. W. Tufts and R. Kumaresan, "Estimation of Frequencies of Multiple Sinusoids: Making Linear Prediction Perform Like Maximum Likelihood," in *Proc. IEEE* vol. 70, pp. 975–89 (1982).

The concept of a parallel architecture for superresolution spectrum analysis is disclosed in Silverstein et al., "Parallel Architectures for Multirate Superresolution Spectrum Analyzers," in *IEEE Transactions on Circuits and Systems*, vol. 38, no. 4 (April 1991), which is incorporated herein by reference. Silverstein et al. discloses the use of parallel architecture for sub-band division using single side-band modulation and filtering followed by decimation, but fails to disclose a computationally efficient superresolution processor and spectral synthesizer for application to the decimated signal.

What is needed is a superresolution signal processing system and method which provides improved resolution in real-time applications involving signals that are observable for only a limited period of time.

SUMMARY OF THE INVENTION

In accordance with the present invention, there is provided a signal processing system (100) and method which uses a subband filter approach (102) combined with the constrained total least squares (CTLS) parameter estimation technique (105) to achieve improved resolution in spectral analysis of signals in environments where the signals are observable for only a limited period of time. Thus, the present invention is of particular applicability in real-time implementations when the incoming signal (101) is changing, transient, or of inherently short duration, or when immediate response is required upon observation of the signal. The invention is able to extract signal parameter information with high accuracy and resolution. The system and method disclosed herein may be applied to samples from various sensors including radar, sonar, focal plane general scientific information, and other sources. Thus, the invention may be used, for example, in applications involving signal recognition in the presence of jamming or other interference; direction finding; determination and extraction of acoustic or electromagnetic resonances in the presence of a decaying constant; Nuclear Magnetic Resonance (NMR) analysis; and many other applications.

The technique described herein may be used in place of the Fast Fourier Transform (FFT) to produce a high resolution spectral estimator (108) in real time. The resulting frequency resolution of line spectra is typically one order of magnitude better than that of FFT. In addition, the accuracy of frequency lines is generally better estimated. In particular, the present invention has been shown to provide statistically optimal results in low signal-to-noise environments where the noise is gaussian or otherwise predictable. In contrast to FFT, the present invention can also produce any associated decaying components or coefficients, thus making it useful to estimate impulse responses of systems.

The computationally intensive nature of past attempts at superresolution signal processing has been addressed by providing a scheme whereby incoming signals (101) are split into separate channels for parallel processing to reduce computation time. Data decimation is used to reduce computational complexity by performing several low-order estimations in place of a single high-order estimation. See Steedly et al., "A Modified TLS-Prony Method using Data Decimation," in *IEEE Transactions on Signal Processing*, vol. 42, no. 9 (September 1994), which is incorporated herein by reference.

In addition, the parallel implementation that may be provided by the invention allows additional resolution and performance to be obtained by providing additional filters and associated hardware, thus facilitating substantial scalability of the design.

BRIEF DESCRIPTION OF THE DRAWINGS

FIG. 1 is a functional block diagram of a superresolution signal processor according to the present invention.

FIG. 2 is a frequency response curve for a finite impulse response (FIR) low-pass filter design using the Remez exchange FIR filter design algorithm according to an embodiment of the present invention.

FIG. 3 is a frequency response curve for a filter-bank network using 16 translates of a low-pass filter, according to an embodiment of the present invention.

FIG. 4 is a block diagram showing an architecture for implementing one embodiment of the present invention.

DETAILED DESCRIPTION OF THE PREFERRED EMBODIMENTS

Referring now to FIG. 1, there is shown a functional block diagram of a superresolution signal processor 100 according to an embodiment of the present invention. The various components of processor 100 perform the following operations to implement a real-time superresolution signal processing: subband filtering; downconversion and decimation; data matrix/vector construction; solution of linear prediction coefficients equations by Iterative Quadratic Maximum Likelihood (IQML) technique; and extraction of frequencies and amplitudes from roots of linear prediction polynomial. In one embodiment, a parallel architecture implementation is used since it can cut down processing time considerably.

In one embodiment, the functional elements of FIG. 1 are implemented in software coded in MATLAB or C languages in a conventional computer system.

Figure 7:
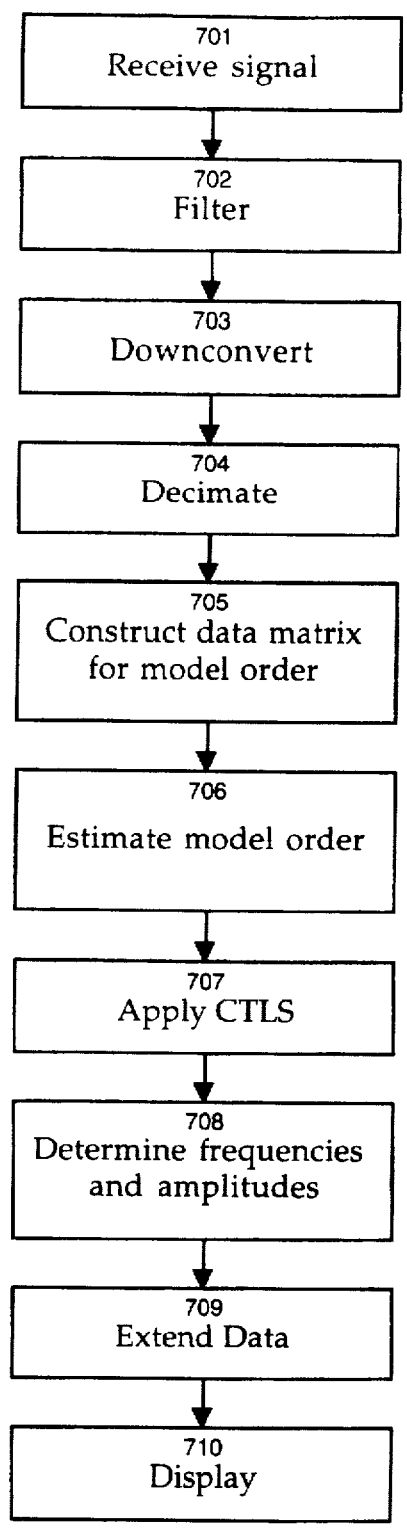
FIG. 7 is a flowchart of a superresolution signal processing method according to the present invention.

Referring now also to FIG. 7, there is shown a flowchart of the steps performed by the functional elements of FIG. 1 according to one embodiment of the present invention. Incoming signal 101, represented as a series of samples $x_n$, is received 701 and filtered 702 by a bank 102 of programmable bandpass filters 103: $\{h_{n,k}\}$, where k is the filter corresponding to the pass band:

$$\left[\frac{(k-1)}{K}, \frac{k}{K}\right].$$

The sampling rate of the signal is normalized to 1, though other sampling rates may be used in connection with the present invention. The output of the kth filter 103 is:

$$y_{n,k} = \sum_{p=1}^{P} h_p x_{n-p}; P \leq n - 1 < N; k = 1, \ldots, K \quad \text{(Eq. 1)}$$

where P=number of taps in filter;

K=number of filters.

In one embodiment, bandpass filters 103 downconvert 703 the filtered output as follows. The output from the kth filter is downconverted by applying $$y_{n,k\_BB} = y_{n,k} \exp(-2\pi j n(k-1)/K); P+1 \leq n \leq N; k=1, \ldots, K \quad \text{(Eq. 2)}$$

Referring now also to FIG. 2, there is shown a frequency response curve 201 for a finite impulse response (FIR) low-pass filter design using the well-known Remez exchange FIR filter design algorithm according to an embodiment of the present invention with a passband of [−0.03125, 0.03125] and a stopband of [0.03125, 0.9625]. The Remez design minimizes the filter maximum error in the stopband for a fixed ripple in the pass band. A. V. Oppenheim and R. W. Schafer, *Digital Signal Processing*, Englewood Cliffs, N.J. (1975).

Referring now also to FIG. 3, there is shown a frequency response curve for a filter-bank network using 16 translates of a low-pass filter, according to an embodiment of the present invention.

Downconverted filter output is then decimated 704 using a decimation ratio of:

$$M = \text{floor}\left(\frac{K}{1+\alpha}\right) \quad \text{(Eq. 3)}$$

where $\alpha = \dfrac{\text{Bandwidth of filter transition band}}{\text{Bandwidth of filter passband}}$ The decimated signal is defined by $$\tilde{y}_{m,k} = y_{mM,k\_BB}; \frac{P+1}{M} \leq m \leq \frac{N}{M} \quad \text{(Eq. 4)}$$

The length of $\tilde{y}_{m,k}$ is $$Q = \frac{N-P}{M} \quad \text{(Eq. 5)}$$

for each k.

The decimated signal is then sent to select analysis window 104, which isolates a time segment of the signal whose spectrum we wish to obtain.

Next, the output from windows 104 is applied to high resolution spectral estimator 108. For each output from windows 104, spectral estimator 108 derives decay coefficients, frequency, and power 105 according to the constrained total least-squares (CTLS) technique. The CTLS methodology is described in Abatzoglou et al., "The Constrained Total Least Squares Technique and its Applications to Harmonic Superresolution," in *IEEE Transactions on Signal Processing*, vol. 39, no. 5 (May 1991), which is incorporated herein by reference. The frequency estimates produced by CTLS are optimal in the sense that they have the lowest possible mean square errors.

In one embodiment of the present invention, high resolution spectral estimator 108 implements CTLS by 1) constructing 705 a data matrix for model order estimation; 2) performing 706 a model order estimation; 3) applying 707 a CTLS algorithm; and 4) determining 708 the frequencies and amplitudes from the roots of the linear prediction polynomial. Each of these steps will now be described in turn.

1) Construction 705 of data matrix for model order estimation. The data being analyzed can be represented by a superposition of L sinusoids in additive noise, where L is the model order for the problem. The model order is estimated by defining the data matrix:

$$A_L = \begin{bmatrix} \tilde{y}_1 & \tilde{y}_2 & \tilde{y}_3 & \ldots & \tilde{y}_L \\ \tilde{y}_2 & \tilde{y}_3 & \ldots & \ldots & \tilde{y}_{L+1} \\ \tilde{y}_3 & \tilde{y}_4 & \cdot & \cdot & \tilde{y}_{L+2} \\ \cdot & \cdot & & & \cdot \\ \cdot & \cdot & & & \cdot \\ \cdot & \cdot & & & \cdot \\ \tilde{y}_{Q-L} & \tilde{y}_{Q-L+1} & \ldots & \ldots & \tilde{y}_{Q-1} \\ \tilde{y}_{L+1} & \tilde{y}_L & \ldots & & \tilde{y}_2 \\ \tilde{y}_{L+2} & \tilde{y}_{L+1} & \ldots & & \tilde{y}_3 \\ \cdot & \cdot & & & \cdot \\ \cdot & \cdot & & & \cdot \\ \cdot & \cdot & & & \cdot \\ \tilde{y}_Q & \tilde{y}_{Q-1} & \ldots & & \tilde{y}_{Q-L+1} \end{bmatrix} \quad \text{(Eq. 6)}$$

$$\vec{b}_L = \begin{bmatrix} \tilde{y}_{L+1} \\ \tilde{y}_{L+2} \\ \cdot \\ \cdot \\ \cdot \\ \tilde{y}_Q \\ \tilde{y}_1 \\ \tilde{y}_2 \\ \cdot \\ \cdot \\ \cdot \\ \tilde{y}_{Q-L} \end{bmatrix}$$

This matrix is filled from the data samples: $\tilde{y}_n$ and it is made into a nearly square matrix by choosing L to be (2Q−1)/3, where Q is the total number of samples and L is the order of the linear prediction equations. The dimension of this matrix is chosen so that its singular values are computed with the highest possible accuracy. This includes the estimation of the noise floor that uses the smallest singular values.

Appended data matrix $C_L = [A_L : \vec{b}_L]$ is then formed from matrix $A_L$ and vector $\vec{b}_L$.

2) Model order estimation 706. Once the appended data matrix $C_L$ has been formed, the singular values $\{\lambda_i\}_{i=1}^L$ and singular vectors of $C_L$ are computed and the Q/2 strongest singular values and corresponding singular vectors are used to reconstruct a "signal-like" data matrix. The noise floor is now computed as the mean square error between $C_L$ and the "signal-like" data matrix.

The model order for the number of signals is estimated by:

$$\text{Minimum}\{N_1, N_2\} \quad \text{(Eq. 7)}$$

where $N_1$ = number of singular values that are larger than (noise floor+10 dB); and $N_2$ = number of singular values that are larger than (largest singular value-threshold). The threshold depends on the estimated signal-to-noise ratio (SNR). A typical value is 30 dB.

Thus, at low SNRs, model order tends to be determined by $N_1$, while at higher SNRs model order is determined by $N_2$. This is desirable, because at higher SNRs, the threshold gives the dynamic range of the signal components to be extracted by the algorithm.

The model order thus represents an estimate of the number of sinusoids present, represented as $\hat{L}$ 3) CTLS implementation 707. Once the model order is determined, CTLS can be applied. The model order defines the dimension of the matrices in the CTLS method. CTLS is a method of solving the linear system of equations:

$$C_L \begin{bmatrix} \vec{\gamma} \\ -1 \end{bmatrix} = 0$$

in an optimal fashion, when the coefficients are perturbed by noise; where $\vec{\gamma}$ is the vector of linear prediction coefficients for the data samples. The CTLS solution is obtained by $$\min_{\vec{\beta}} \{F(\vec{\beta})\} \quad \text{(Eq. 8)}$$

$$F(\vec{\beta}) = \begin{pmatrix} \vec{\beta} \\ -1 \end{pmatrix}^* C_L^* [H_{\vec{\beta}} H_{\vec{\beta}}^*]^{-1} C_L \begin{pmatrix} \vec{\beta} \\ -1 \end{pmatrix} \quad \text{(Eq. 9)}$$

$$H_{\vec{\beta}} = \begin{bmatrix} \beta_1 & \beta_2 & \ldots & \beta_K & -1 & 0 & \ldots & 0 \\ 0 & \beta_1 & \beta_2 & \ldots & \beta_K & -1 & \ldots & 0 \\ \cdot & \cdot & \cdot & \cdot & \cdot & \cdot & & \cdot \\ \cdot & \cdot & \cdot & \cdot & \cdot & \cdot & & \cdot \\ \cdot & \cdot & \cdot & \cdot & \cdot & \cdot & & \cdot \\ 0 & \ldots & 0 & \beta_1 & \beta_2 & \ldots & \beta_K & -1 \end{bmatrix} \quad \text{(Eq. 10)}$$

Thus, the CTLS solution is obtained by minimizing Equation 8. According to one embodiment of the invention, this is implemented by performing a coarse search to yield a vector close to the CTLS solution, followed by a fine search starting at the value provided by the coarse search. The coarse search is based on the Iterative Quadratic Maximum Likelihood (IQML) algorithm, and results in an approximate estimate of the linear prediction coefficient vector $\vec{\beta}$. The fine search uses the complex Newton algorithm to obtain the exact value of the CTLS algorithm.

3A) Coarse search, the IQML algorithm is a recursion of the form, $$\beta_{n+1} = [A_{L,F}^*(H_{\beta_n}H_{\beta_n}^*)^{-1}A_{L,F} + A_{L,B}^*((H_{\beta_n}H_{\beta_n}^*)^{-1})^T A_{L,B}]^{-1}(A_{L,F}^*(H_{\beta_n}H_{\beta_n}^*)^{-1}\vec{b}_{L,F} + A_{L,B}^*((H_{\beta_n}H_{\beta_n}^*)^{-1})^T \vec{b}_{L,B}) \quad \text{(Eq. 11)}$$

where:

$(H_{\beta_n}H_{\beta_n}^*)$ is a Hermitian, Toeplitz bandlimited matrix of bandwidth $\hat{L}$ (thus it can be inverted by fast and robust algorithms; see, for example, Zohar, "Toeplitz Matrix Inversion: The Algorithm of W. F. Trench," in *Journal of the ACM*, vol. 16, no. 4 (October 1969).

$A_{L,F}$ and $A_{L,B}$ are the upper (forward) and lower (backward) parts of $A_L$ (these are of dimension (Q−L)×L); and $(H_{\beta n} H_{\beta n}^*)$ = complex matrix of dimension $(Q-L) \times (Q-L)$.

For further discussion of IQML, see Bresler and Macovski, "Exact Maximum Likelihood Parameter Estimation of Superimposed Exponentials in Noise," in *IEEE Trans. Acoust., Speech, Signal Processing*, vol. ASSP-34, pp. 1081–89 (October 1986).

Usually, the IQML technique requires between five and 20 iterations to converge. In one embodiment of the invention, the solution provided by the IQML technique is output as the CTLS solution, since the IQML solution is often a good estimate for the CTLS solution. In this manner the additional computational load of the fine search may be omitted. In other embodiments, the fine search is performed subsequent to the IQML technique in order to further refine the results.

3B) Fine search. Here the system uses the complex version of the Newton algorithm for finding the minimum of a function. This uses for its initial estimate the value of $\vec{\beta}$ provided by the IQML algorithm and yields, generally after three to four iterations, the precise CTLS solution. The complex Newton algorithm is an iterative technique for finding the minimum of $F(\vec{\beta})$ and it is defined by:

$$\vec{\beta}_{n+1} = \vec{\beta}_n + (\overline{D}E^{-1}D - \overline{E})^{-1}(\vec{a} - \overline{D}E^{-1}\vec{a}) \quad \text{(Eq. 12)}$$

where:

$$\vec{a} = \left[ \frac{\partial F}{\partial \beta_1} \cdots \frac{\partial F}{\partial \beta_L} \right]^T = \text{complex gradient of } F$$

$$D = \frac{1}{2}\left( \frac{\partial^2 F}{\partial^2 \beta} + \frac{\partial^2 F^T}{\partial^2 \beta} \right) = \text{unconjugated complex Hessian of } F$$

$$B = \frac{\partial^2 F}{\partial \beta^* \partial \beta} = \text{conjugated complex Hessian of } F$$

The quantities $\vec{a}$, D and E can be computed both in closed form and numerically. The Newton technique converges quadratically near the solution and generally requires at most three to four iterations to converge.

4) Determination of frequencies and amplitudes 708. After CTLS has been applied, system 100 determines the desired estimated frequencies by computing the roots of the polynomial with the linear prediction coefficients:

$$0 = \beta_1 + \beta_2 z + \beta_3 z^2 + \ldots + \beta_L z^{L-1} - z^L \quad \text{(Eq. 13)}$$

The frequencies are then found from:

$$f_n = \left\{ \arg\left( \frac{\zeta_n}{2\pi} \right) \right\}. \quad \text{(Eq. 14)}$$

where $\{\zeta_1\}$ are the roots of Equation 13.

System 100 determines the amplitudes of the extracted frequencies by the formula:

$$\vec{z} = (\Psi^* \Psi)^{-1} \Psi^* \vec{y} \quad \text{(Eq. 15)}$$

where $\Psi$ is the frequency steering matrix:

$$\Psi = \begin{bmatrix} 1 & 1 & \cdots & 1 \\ \exp(2\pi j f_1) & \exp(2\pi j f_2) & \cdots & \exp(2\pi j f_L) \\ \vdots & \vdots & \cdots & \vdots \\ \exp(2\pi j(Q-1)f_1) & \exp(2\pi j(Q-1)f_2) & \cdots & \exp(2\pi j(Q-1)f_L) \end{bmatrix}$$

and $$\vec{y} = \begin{bmatrix} y_1 \\ y_2 \\ \vdots \\ y_Q \end{bmatrix}$$

Thus, $\vec{z}$ contains information describing the relative amplitude of each sinusoidal frequency component in the signal. The magnitudes of the roots $\{\zeta_1\}$ indicate whether the frequencies are decaying.

Using the information derived from step 708, frequencies and amplitude 106 for each band are combined 108 and, in one embodiment, a table or graph is output showing the frequency components and their amplitudes.

In another embodiment of the present invention, data is extended 709 in the time domain based on the information derived from step 708. In this way, additional sample points are generated and a conventional FFT is applied to the extended data set. This extension and display permits the output from the above-described technique to be displayed in a way that is familiar and informative to the user.

The data extension can be done by the formula:

$$\vec{y}_{ext} = \Psi_{ext} \vec{z}, \quad \text{(Eq. 16)}$$

where $$\Psi_{ext} = \begin{bmatrix} \left(\frac{1}{w_1}\right)^P & \left(\frac{1}{w_2}\right)^P & \cdots & \left(\frac{1}{w_L}\right)^P \\ \vdots & \vdots & & \vdots \\ \frac{1}{w_1} & \frac{1}{w_2} & \cdots & \frac{1}{w_L} \\ 1 & 1 & \cdots & 1 \\ w_1 & w_2 & \cdots & w_L \\ \vdots & \vdots & & \vdots \\ w_1^{Q-1} & w_2^{Q-1} & \cdots & w_L^{Q-1} \\ w_1^Q & w_2^Q & \cdots & w_L^Q \\ \vdots & \vdots & & \vdots \\ w_1^{Q+P} & w_2^{Q+P} & \cdots & w_L^{Q+P} \end{bmatrix},$$

where:

-continued $$w_n = \zeta_n \text{ if } |\zeta_n| \leq 1;$$

$$w_n = \frac{\zeta_n}{|\zeta_n|} \text{ if } |\zeta_n| > 1;$$

All roots larger than 1 in magnitude are mapped onto the unit circle. This ensures stability of the extension.

To obtain a familiar and informative spectral display 710, one embodiment of the present invention takes the FFT of $\vec{y}_{ext}$ and displays the log of 10 the magnitude. In one embodiment, pure sinusoid components have pole locations which lie on the unit circle while decaying sinusoids have poles inside the unit circle. These are displayed as described below in connection with FIG. 8C. To do spectral synthesis 107 the spectral information from the kth bandpass filter is referenced to:

$$\frac{(k-1)}{K} + f_m/M, \qquad \text{(Eq. 17)}$$

where $f_m$ is a frequency obtained in the kth subband and only the ones between 0 and $$\frac{1}{1+\alpha}$$

are acceptable. Corresponding complex poles $w_m$ are referenced to:

$$|w_m|^{1/M} \exp(2\pi j((k-1)/K + f_m/M)) \qquad \text{(Eq. 18)}$$

In one embodiment, the output is then used in spectral analysis applications 109.

Figure 5A:
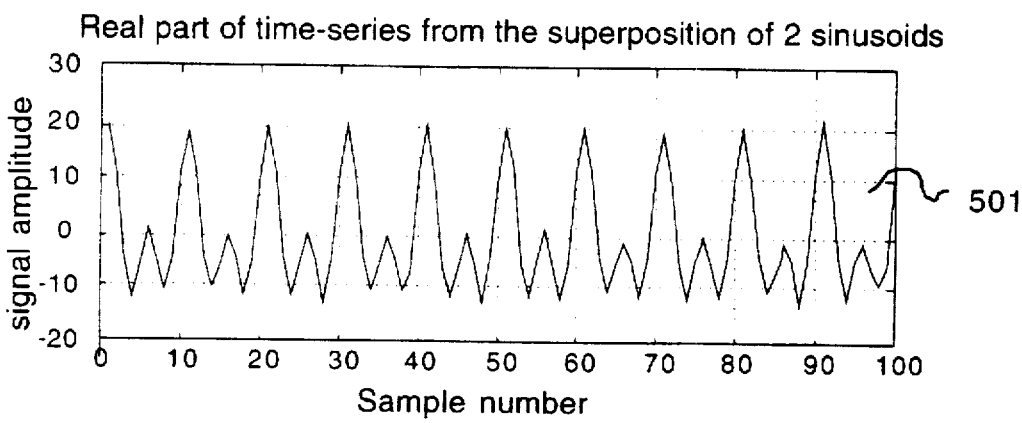
FIG. 5A shows a time series for a signal containing two sinusoidal components.
Figure 5B:
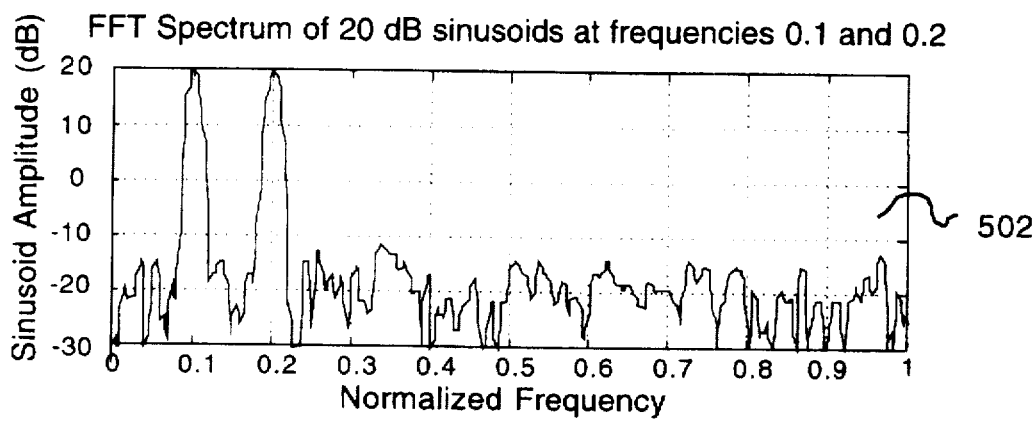
FIG. 5B shows an FFT spectrum for the signal of FIG. 5A.
Figure 5C:
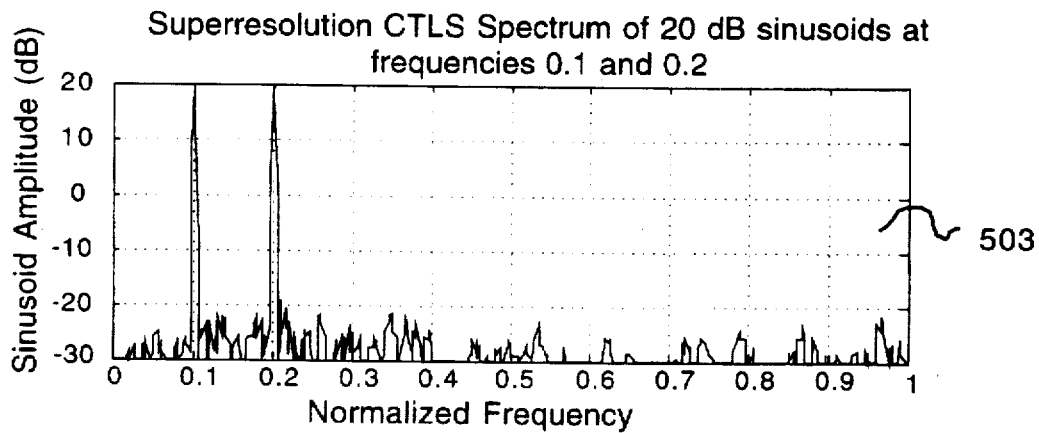
FIG. 5C shows a spectrum according to the present invention for the signal of FIG. 5A.

Referring now to FIGS. 5A, 5B, and 5C, there is shown an example of the application of the present invention to a signal. FIG. 5A shows a time series 501 containing 100 samples of a signal containing two sinusoidal components of equal amplitude at 100 Hz and 200 Hz, respectively, with a signal-to-noise ratio (SNR) of 20 dB. FIG. 5B shows an FFT spectrum 502 for the signal obtained by conventional means. FIG. 5C shows a spectrum 503 for the signal obtained by the method described herein, including filtering, CTLS, data extension and FFT performed on the extended data.

Figure 6A:
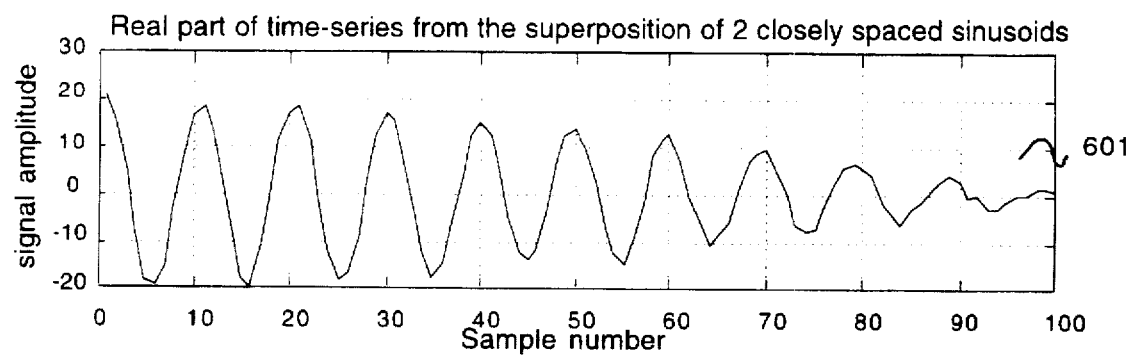
FIG. 6A shows a time series for a signal containing two closely spaced sinusoidal components.
Figure 6B:
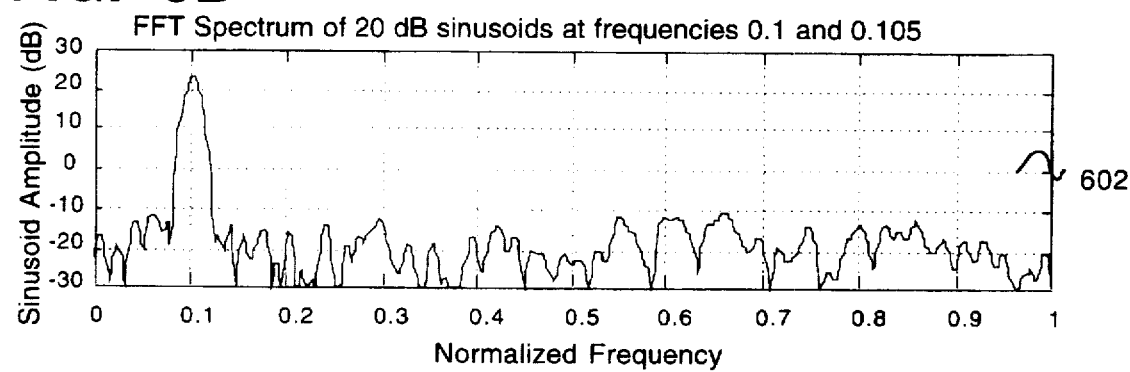
FIG. 6B shows an FFT spectrum for the signal of FIG. 6A.
Figure 6C:
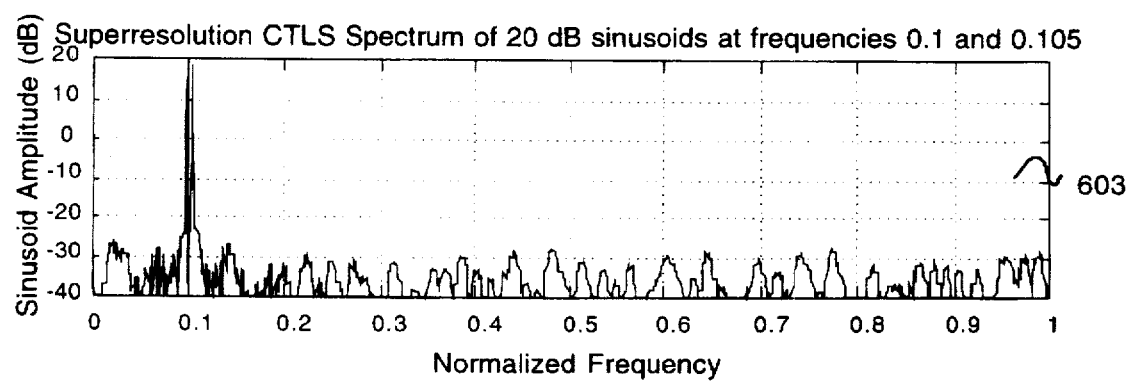
FIG. 6C shows a spectrum according to the present invention for the signal of FIG. 6A.

Referring now to FIGS. 6A, 6B, and 6C, there is shown an example of the application of the present invention to a signal containing closely-spaced sinusoidal components. FIG. 6A shows a time series 601 containing 100 samples of a signal containing two sinusoidal components of equal amplitude at 100 Hz and 105 Hz, respectively, with a SNR of 20 dB. FIG. 6B shows an FFT spectrum 602 for the signal obtained by conventional means. FIG. 6C shows a spectrum 603 for the signal obtained by the method described herein, including filtering, CTLS, data extension and FFT performed on the extended data. It is noted that while the conventional FFT spectrum 602 fails to resolve the two closely-spaced sinusoidal components, spectrum 603 successfully resolves them. Thus, the method of the present invention provides increased resolution.

Figure 8A:
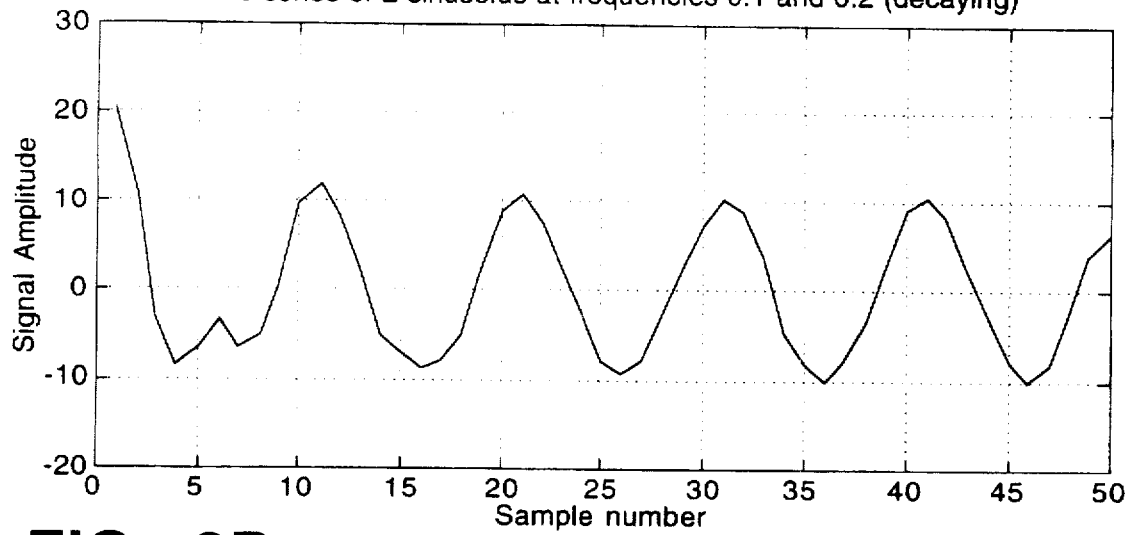
FIG. 8A shows a time series for a signal containing two sinusoidal components, one decaying.
Figure 8B:
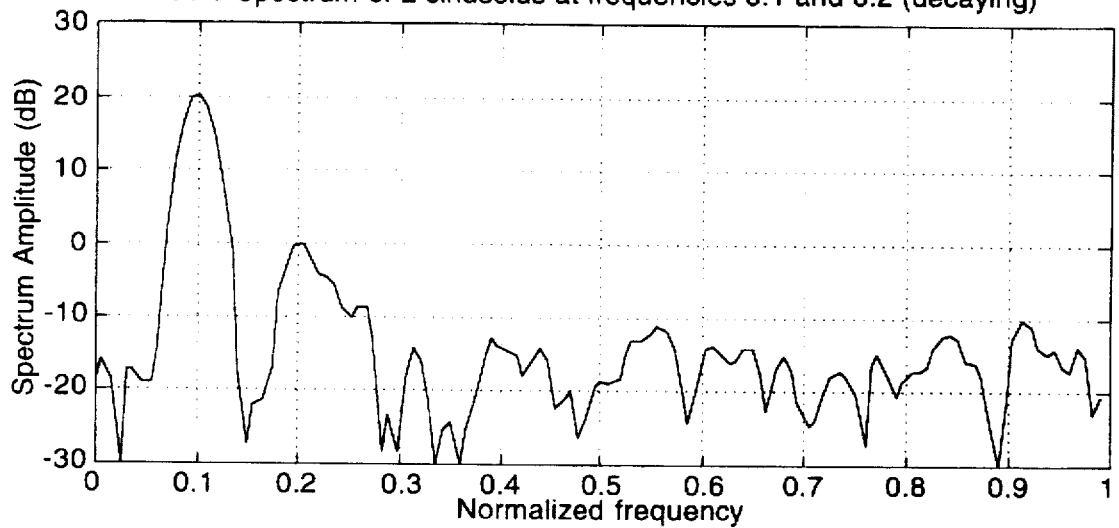
FIG. 8B shows an FFT spectrum for the signal of FIG. 8A.
Figure 8C:
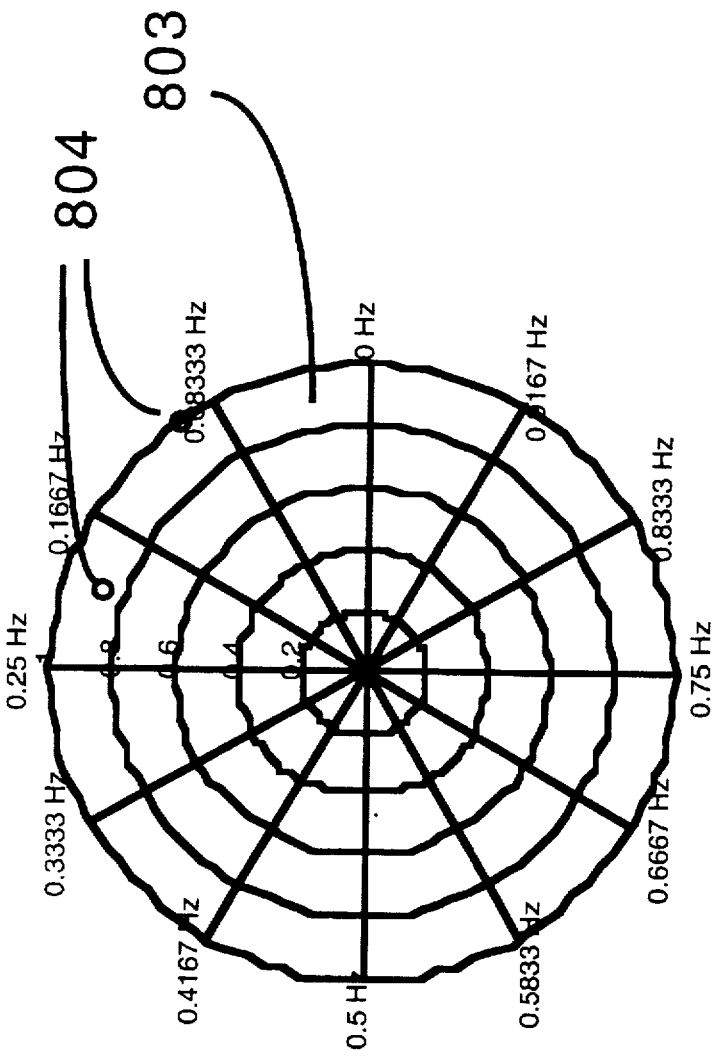
FIG. 8C shows a polar plot resulting from application of CTLS to the signal of FIG. 8A.
Figure 8D:
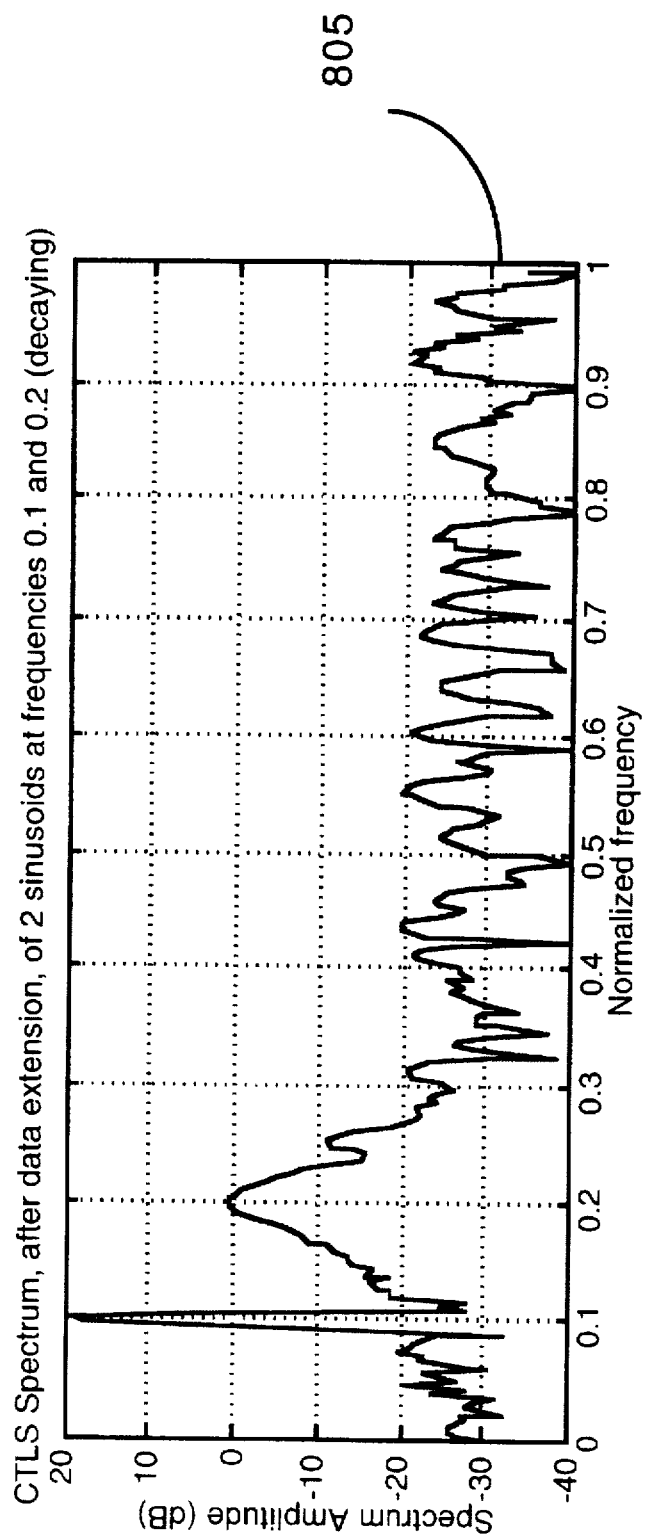
FIG. 8D shows a spectrum according to the present invention for the signal of FIG. 8A.

Referring now to FIGS. 8A, 8B, 8C, and 8D, there is shown an example of the application of the present invention to a signal containing a decaying component. It should be noted that FFT has no provision for estimating the decay coefficients for such a signal. FIG. 8A shows a time series 801 containing 50 samples of a signal containing two sinusoidal components, one of which is decaying. FIG. 8B shows an FFT spectrum 802 for the signal obtained by conventional means. FIG. 8C shows a polar plot 803 of the spectral analysis for the signal obtained by the method described herein, including filtering, CTLS, data extension and FFT performed on the extended data. Extracted resonances are indicated by asterisks 804. FIG. 8D shows a spectrum 805 for the signal obtained by the method described herein. It is noted that while the conventional FFT spectrum 802 does not characterize well the decaying sinusoid component at the 0.3 normalized frequency, polar plot 803 and spectrum 805 show both components clearly. The pure sinusoid appears on the unit circle while the decaying one is inside the unit circle. Thus, the method of the present invention provides optimal characterization of decaying sinusoidal components.

Referring now to FIG. 4, there is shown a block diagram showing an architecture for implementing one embodiment of the present invention. In one embodiment, the elements of FIG. 4 are implemented on a series of microchips. Signal 101 is provided to RF module & analog/digital converter 401 which converts signal 101 to a digital signal. The digital signal is then set to a number of bandpass filters 103. As shown in FIG. 4, one embodiment of the invention includes eight bandpass filters 103 feeding into two spectral estimator modules 402, with the signal also being sent to other modules 407 (not shown). The more modules 402 are available, the more parallelism in signal processing can be accomplished.

Each spectral estimator module 402 contains four high resolution spectral estimators 403 implemented using available digital signal processing (DSP) chips. The object code describing the estimator 403 is first downloaded onto the DSP board. Typically, this object code is downloaded from an electrically erasable programmable read-only memory (EEPROM). For fastest execution, is has been found advantageous for the object code to ultimately reside either in fast on-chip random access memory (RAM) or off-chip in zero-wait state static RAM (SRAM), thought other types of memory may also be used. Each estimator 403 performs the CTLS technique as described above. Each estimator 403 has access to a global memory 405 common to other estimators 403 in the same module 402. Memory 405 can be used as a workspace to exchange information and results between estimators 403.

High resolution output 406 containing frequency and amplitude information is generated by estimators 403 and sent to an output device (not shown) for display to the user, as described above.

Other embodiments are possible without departing from the essential characteristics of the invention. For example, the functional elements set forth herein may be implemented in software or hardware.

From the above description, it will be apparent that the invention disclosed herein provides a novel and advantageous real-time superresolution signal processing system and method. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A superresolution signal processing method, comprising:
   (a) receiving a signal;
   (b) filtering the received signal through a plurality of filters to obtain a plurality of filtered signals;
   (c) downconverting the filtered signals;
   (d) estimating component frequencies and amplitudes of each filtered signal by:
      (d.1) constructing a data matrix for model order estimation;
      (d.2) performing model order estimation using the constructed data matrix;
      (d.3) applying constrained total least squares to obtain a polynomial with a plurality of linear prediction coefficients;
      (d.4) determining the roots of the obtained polynomial to obtain frequencies; and
      (d.5) determining amplitudes of the obtained frequencies; and
   e) outputting the estimated component frequencies and amplitudes of each filtered signal.

2. The superresolution signal processing method of claim 1, wherein step (d.3) comprises:
   (d.3.1) performing a coarse search using an iterative quadratic maximum likelihood technique; and
   (d.3.2) selectively performing a fine search using a complex Newton algorithm.

3. The superresolution signal processing method of claim 1, further comprising, after step (d.4):
   (d.4.1) obtaining decaying coefficients from the determined roots.

4. A superresolution signal processing method comprising:
   (a) receiving a signal;
   (b) filtering the received signal through a plurality of filters to obtain a plurality of filtered signals;
   (c) downconverting the filtered signals;
   (d) estimating component frequencies and amplitudes of each filtered signal by applying a constrained total least squares technique;
   (e) performing spectral synthesis on the results of (d); and
   (f) outputting the results of the spectral synthesis representing the estimated component frequencies and amplitudes of each filtered signal.

5. A superresolution signal processing method, comprising:
   (a) receiving a signal;
   (b) filtering the received signal through a plurality of filters to obtain a plurality of filtered signals;
   (c) downconverting the filtered signals;
   (d) estimating component frequencies and amplitudes of each filtered signal by applying a constrained total least squares technique;
   (e) extending the signal using estimated component frequencies and amplitudes;
   (f) performing spectral analysis on the extended signal; and
   (g) outputting the results of the spectral analysis representing the estimated component frequencies and amplitudes of each filtered signal.

6. A superresolution signal processing method, comprising:
   (a) receiving a signal;
   (b) converting the received signal into a digital signal;
   (c) filtering the digital signal through a plurality of digital bandpass filters to obtain a plurality of filtered signals;
   (d) downconverting the filtered signals;
   (e) decimating the downconverted signals;
   (f) constructing a data matrix for model order estimation for the decimated signals;
   (g) performing model order estimation using the constructed data matrix;
   (h) applying a constrained least squares technique to obtain a polynomial with a plurality of linear prediction coefficients, the constrained least squares technique comprising a coarse search using an iterative quadratic maximum likelihood technique and selectively comprising a fine search using a complex Newton algorithm;
   (i) determining the roots of the obtained polynomial to obtain frequencies;
   (j) determining amplitudes of the obtained frequencies;
   (k) extending the received signal using estimated component frequencies and amplitudes;
   (l) performing spectral analysis on the extended signal; and
   (m) outputting the results of the spectral analysis.

7. A superresolution signal processor, comprising:
   a plurality of filters for filtering and downconverting a received signal;
   a plurality of spectral estimator modules respectively coupled to the filters for estimating component frequencies, decaying coefficients and amplitudes of the filtered signals using a constrained total least squares technique; and
   an output device coupled to the spectral estimator modules for outputting the component frequencies and amplitudes;
   each of the spectral estimator modules comprising:
   a downconverter for downconverting the filtered signals;
   a decimator coupled to the downconverter, for decimating the downconverted signals;
   a data matrix constructor coupled to the decimator, for constructing a data matrix for model order estimation;
   a model order estimator coupled to the data matrix constructor, for performing model order estimation;
   a linear prediction coefficient generator coupled to the model order estimator, for applying constrained least squares to obtain a polynomial with a plurality of linear prediction coefficients; and
   a spectrum analyzer coupled to the coefficient generator, for determining the roots of the obtained polynomial to obtain frequencies and for determining amplitudes of the obtained frequencies.

8. A superresolution signal processor, comprising:
   a plurality of filters for filtering and downconverting a received signal;
   a plurality of spectral estimator modules respectively coupled to the filters for estimating component frequencies, decaying coefficients and amplitudes of the filtered signals using a constrained total least squares technique;

an output device coupled to the spectral estimator modules for outputting the component frequencies and amplitudes;

a spectrum synthesizer coupled to the spectral estimator modules and to the output device, for performing spectral synthesis;

wherein the output device outputs the results of the spectrum synthesizer.

9. The method of claim 1, wherein step (d.2) comprises:

(d.2.1) determining singular values and singular vectors of the constructed data matrix;

(d.2.2) reconstructing a new data matrix using a subset of the determined singular values and singular vectors;

(d.2.3) establishing a noise floor; and (d.2.4) estimating a model order from the number of singular values exceeding a predetermined level with respect to the noise floor and from the number of singular values exceeding a predetermined singular value threshold.

10. A method of estimating component frequencies and amplitudes of a filtered signal, comprising:

(a) constructing a data matrix for model order estimation;

(b) performing model order estimation using the constructed data matrix;

(c) applying constrained total least squares to obtain a polynomial with a plurality of linear prediction coefficients;

(d) determining the roots of the obtained polynomial to obtain frequencies; and (e) determining amplitudes of the obtained frequencies.

* * * * *